(12) United States Patent
Abedifard et al.

(10) Patent No.: US 9,558,802 B2
(45) Date of Patent: Jan. 31, 2017

(54) FAST PROGRAMMING OF MAGNETIC RANDOM ACCESS MEMORY (MRAM)

(71) Applicant: Avalanche Technology, Inc., Fremont, CA (US)

(72) Inventors: Ebrahim Abedifard, San Jose, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 15/203,455

(22) Filed: Jul. 6, 2016

(65) Prior Publication Data

US 2016/0314828 A1    Oct. 27, 2016

Related U.S. Application Data

(60) Division of application No. 14/253,192, filed on Apr. 15, 2014, now Pat. No. 9,401,194, which is a continuation of application No. 13/842,747, filed on Mar. 15, 2013, now Pat. No. 8,792,269.

(51) Int. Cl.
  *G11C 11/00*     (2006.01)
  *G11C 11/16*     (2006.01)

(52) U.S. Cl.
  CPC ........ *G11C 11/1675* (2013.01); *G11C 11/1653* (2013.01)

(58) Field of Classification Search
  CPC .................................................... G11C 11/16
  USPC ....... 365/48, 55, 62, 66, 74, 78, 80–93, 100, 365/130, 131, 148, 158, 171–173, 209, 365/213, 225.5, 230.07, 232, 243.5; 216/22; 257/295, 421, E21.665; 438/3; 428/810–816, 817–825.1, 826; 977/933–935

See application file for complete search history.

(56) References Cited

U.S. PATENT DOCUMENTS

| | | | | |
|---|---|---|---|---|
| 7,742,329 B2* | 6/2010 | Yoon | ....................... | G11C 11/16 365/158 |
| 7,755,153 B2* | 7/2010 | Ho | ....................... | H01L 27/228 257/421 |
| 8,107,280 B2* | 1/2012 | Yoon | ....................... | G11C 11/16 365/158 |
| 2004/0175887 A1* | 9/2004 | Cha | ....................... | H01L 27/228 438/257 |
| 2007/0164381 A1* | 7/2007 | Ho | ....................... | H01L 27/228 257/421 |
| 2008/0219043 A1* | 9/2008 | Yoon | ....................... | G11C 11/16 365/158 |
| 2010/0110775 A1* | 5/2010 | Yoon | ....................... | G11C 11/16 365/158 |

* cited by examiner

*Primary Examiner* — Harry W Byrne
(74) *Attorney, Agent, or Firm* — Maryam Imam; Bing K. Yen (57) ABSTRACT

A method of programming an MTJ includes selecting an MTJ that is coupled to an access transistor at the drain of the access transistor. The gate of the access transistor is coupled to a selected word line (WL), the selected WL being substantially at a first voltage, Vdd; whereas the WLs that are not coupled to the MTJ are left to float. A second voltage, Vx, is applied to the unselected bit lines (BLs) and further applied to a source line (SL), the SL being coupled to the source of the access transistor. A third voltage, Vdd or 0 Volts, is applied to a selected BL, the selected BL being coupled the MTJ. The first voltage is applied to a SL, the SL being coupled to the source of the access transistor thereby causing the WL to boot above the first voltage.

3 Claims, 6 Drawing Sheets

FIG. 6

FAST PROGRAMMING OF MAGNETIC RANDOM ACCESS MEMORY (MRAM)

CROSS REFERENCE TO RELATED APPLICATIONS

The present application is a divisional application of the commonly assigned application bearing Ser. No. 14/253,192 filed on Apr. 15, 2014 and entitled "Fast Programming of Magnetic Random Access Memory (MRAM)," which is a continuation of U.S. patent application Ser. No. 13/842,747, filed on Mar. 15, 2013, by Abedifard et al., and entitled "Fast Programming of Magnetic Random Access Memory (MRAM)."

BACKGROUND OF THE INVENTION

Field of the Invention

This invention relates generally to a magnetic random access memory (MRAM) and more particularly to a method and apparatus for programming of MRAMs.

Description of the Prior Art

Magnetic random access memories (MRAMs) include magnetoresistive tunnel junctions (MTJs), effectively the memory element of the MTJ storing binary data. Each MTJ typically has two magnetic layers, separated by a thin barrier layer, generally made of magnesium oxide (MgO), which acts as a tunneling oxide layer of the MTJ. The magnetic orientation in these layers, upon the application of suitable electric current determines the state of the MTJ.

One of the magnetic layers of the MTJ typically has a fixed orientation while the other magnetic layer, typically referred to as a "free layer", can change its orientation during programming of the MTJ. If the two magnetic layers have the same magnetic orientation (parallel state), the resistance of the MTJ is rather low while when they have the opposite magnetic orientation relative to one another (anti-parallel state), the resistance of the MTJ is rather high.

Changing the binary or magnetic orientation (or "state") of an MTJ is referred to as "programming" (or "writing to") the MTJ. Programming is performed by forcing electric current through the MTJ. Electrons passing through the fixed layer of the MTJ and into the free layer of the MTJ force the orientation of the free layer to become the same as that of the fixed layer. Whereas, forcing the electrons to travel from the free layer into the fixed layer, causes the orientation of the fixed layer to remain unchanged, but the bounced electrons from the fixed layer change the orientation of the free layer to be opposite to that of the fixed layer. The amount of current required to change the orientation of the MTJ can be calculated using the following equation:

$$I = I0 * A * [1 - ((K*T)/(K0*V))Ln(t/t0)] \quad \text{Eq. (1)}$$

wherein '*' denotes a multiplication operation and 'I0' is the current density per unit area, which is a variable dependent on the MTJ fabrication technology. 'A', in Eq. (1), is the MTJ area, 'K' is the Boltzmann constant, 'T' is temperature in degrees Kelvin. 'K0' is the resultant magnetic field, 'V' is the volume of the free layer, 't' is time in nano seconds (nSec), and t0 is 1 nSec. The value K0*V/K*T is called delta (Δ), and it is a measure of the stability of the MTJ relative to temperature (or 'T'). Based on the foregoing, the programming time can be calculated as follows:

$$t = t0 \exp[\Delta * (1 - I/I0 * A)] \quad \text{Eq. (2)}$$

Eq. (2) clearly indicates that programming time is exponentially related to the MTJ current, which means in order to reduce programming time, a desired outcome, programming current, needs to be augmented. Programming current, also referred to herein as "electrical current" is typically provided by a select (or "access") transistor that is coupled to the MTJ and selects the MTJ for programming or reading.

The size of the transistor can be arbitrarily made large to boost programming current but enlarging the access transistor has the undesirable effect of increasing the MRAM cell size, the MRAM cell generally includes an MTJ and an access transistor. The size of the MRAM cell is typically dictated by the size of its access transistor. Accordingly, minimizing the size of the MRAM cell typically requires minimizing the size of the access transistor, which results in a fairly small amount of current for programming and/or reading the MTJ. There is therefore a conflict between smaller MTJ cell size versus higher programming current.

Figure 1A:
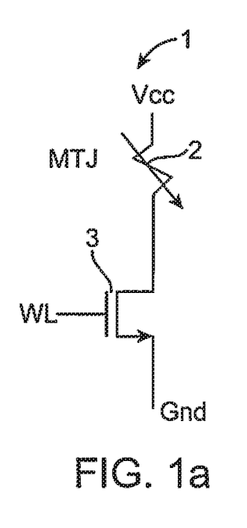
FIG. 1a shows the prior art MTJ 2 programmed from an "AP" state to a "P" state using the transistor 3.
Figure 1B:
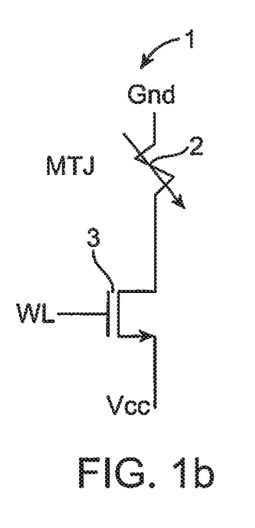
FIG. 1b shows the prior art MTJ 2 programmed from a "P" state to an "AP" state using the transistor 3.

In FIGS. 1a and 1b each show a typical MRAM cell 1 to include an access transistor 3, coupled to an MTJ 2. In FIG. 1a, the prior art MTJ 2, which functions like a variable resistor, is accessed by the transistor 3 through which it is programmed from an anti-parallel (AP) state to a parallel (P) state, or from a high MTJ resistance (R) to a low MTJ R. "Anti-parallel"("AP") refers to the orientation of magnetic layers of the MTJ 2 being opposite to one another whereas, "parallel" ("P") refers to the orientation of the magnetic layers of the MTJ 2 being the same relative to each other, as shown in FIG. 1b.

FIG. 1b shows the prior art MTJ 2 programmed from a "P" state to an "AP" state using the transistor 3. In the latter case, current is exceptionally low, by as much as 40-60 percent. This is largely due to having higher voltage at the source of the transistor 3. The voltage required to program the MTJ 2, in this case, when the MTJ 2 is being programmed from P to AP, has the effect of raising the voltage at the source of the driving (or "access") transistor. Accordingly, the electrical current through the transistor 3 drops due to the reduction of the voltage from gate-to-source of the transistor 3, as well as due to the increase in the Vt of the transistor, which is the threshold voltage of the transistor 3. Vt increases because the voltage at the source of the transistor 3 acts as a substrate bias for the n-channel transistor. In this case, enlarging the size of the transistor 3 does not increase the electrical current of the transistor 3 by much. Thus, the gate voltage of the transistor 3 needs to be increased to compensate for all these. To increase the gate one needs to consider at least two limitations. One is that in most designs the power supply provided is limited for example to only 1 to 1.2 volts. The second limitation is that the transistor has certain tolerance limit to voltage. More than certain levels of voltage could damage the transistor. For example if the transistor is designed for 1.2 volts, voltages in excess of 1.44 V (20% excess voltage) could damage the transistor.

Accordingly, there is a need for an MTJ cell with small cell size yet higher electric current for reliably programming the MTJ.

SUMMARY OF THE INVENTION

Briefly, a method of programming an MTJ includes selecting an MTJ for programming. The MTJ to be programmed is coupled to an access transistor at the drain of the access transistor and the gate of the access transistor is coupled to a selected word line (WL), the selected WL being substantially at a first voltage, Vdd; whereas the WLs that are not coupled to the MTJ are left to float. A second voltage, Vx, is applied to the unselected bit lines (BLs) and further applied to a source line (SL), the SL being coupled to the source of the access transistor. A third voltage, Vdd or 0 Volts, is then applied to a selected BL, the selected BL being coupled to an end of the MTJ other than the end of the MTJ where the access transistor is coupled. The first voltage is applied to a SL, the SL being coupled to the source of the access transistor thereby causing the WL to boot above the first voltage.

These and other objects and advantages of the present invention will no doubt become apparent to those skilled in the art after having read the following detailed description of the preferred embodiments illustrated in the several figures of the drawing.

DETAILED DESCRIPTION OF VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In some embodiments of the invention, in order to overcome low current limitations, such as in the structure shown in FIG. 1b, the voltage at the gate of the access transistor that is coupled to a magnetoresistive tunnel junction (MTJ) of a magnetic random access memory (MRAM) cell, is increased. As is further discussed shortly, two different embodiments and methods are disclosed for increasing or boasting the voltage at the gate of the access transistor or the voltage at a word line that is coupled to the MRAM cell. In one such method, a fixed voltage is used to augment or boost the voltage at the gate of the access transistor and in another such method, a boot strapping technique is employed to augment or boost the voltage at the gate of the transistor.

In one embodiment, a method of programming an MTJ includes selecting an MTJ for programming. The MTJ to be programmed is coupled to an access transistor at the drain of the access transistor and the gate of the access transistor is coupled to a selected word line (WL), the selected WL is substantially at a first voltage, Vdd; whereas the WLs that are not coupled to the MTJ are left to float. A second voltage, Vx, is applied to the unselected bit lines (BLs) and further applied to a source line (SL), the SL being coupled to the source of the access transistor. A third voltage, Vdd or 0 Volts, is then applied to a selected BL, the selected BL is coupled to an end of the MTJ other than the end of the MTJ where the access transistor is coupled. The first voltage is applied to a SL, the SL is coupled to the source of the access transistor thereby causing the WL to boot above the first voltage.

Figure 2:
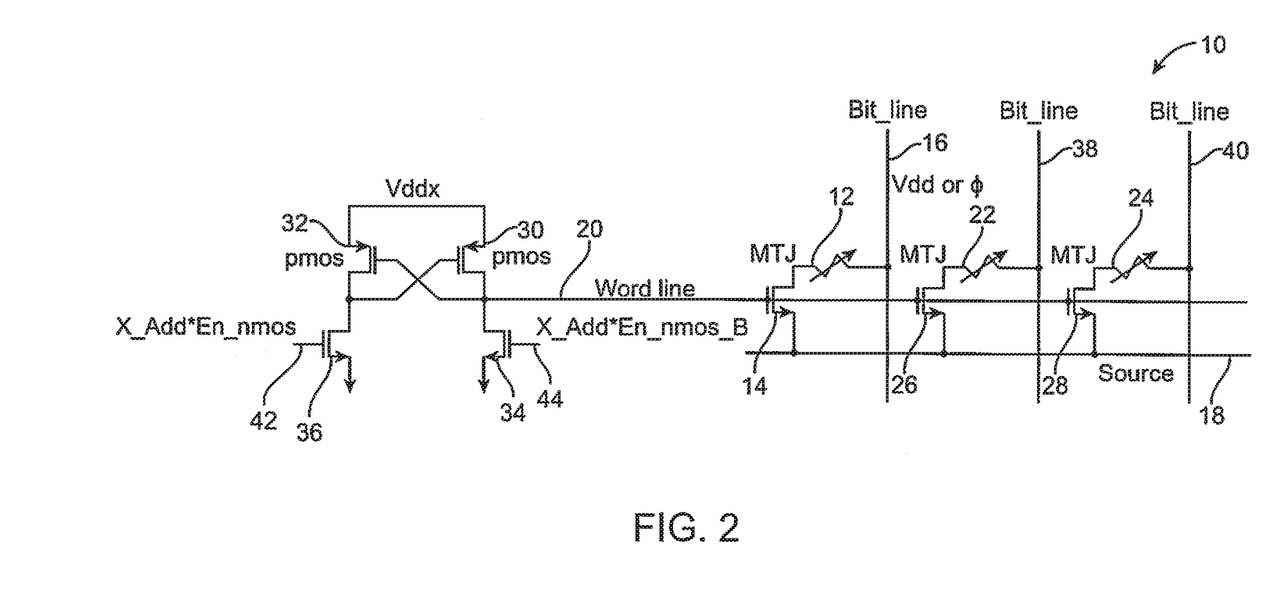
FIG. 2 shows a circuit 10 using a magnetic random access memory (MRAM) device, in accordance with an embodiment and method of the invention.

FIG. 2 shows a circuit 10 using a magnetic random access memory (MRAM) device, in accordance with an embodiment and method of the invention. The circuit 10 is shown to include an MTJ 12, an MTJ 22, and an MTJ 24. It is further shown to include access transistors 14, 26, and 28. Further shown to be a part of the circuit 10 are transistors 36, 34, 32, and 30, and bit lines (BLs) 16, 38 and 40, source line (SL) 18, and word line (WL) 20.

It is understood that while three BLs are shown in FIG. 2, additional BLs may be and are typically a part of the circuit 100. Similarly, while only three MTJs are shown in FIG. 2, the circuit 100 typically includes a greater number of MTJs and additional SLs and WLs.

The MTJ 12 is shown coupled to the transistor 14 at one end and to the BL 16 at an opposite end. Similarly, the MTJ 22 is shown coupled to the transistor 26 at one end and to the BL 38 at another end, and the MTJ 24 is shown coupled at one end to the transistor 28 at one end and to the BL 40 at an opposite end. The transistors 14, 26, and 28 are each shown coupled to the SL 18 at their respective drains and to the WL 20 at their respective gates. The transistors 34 and 36 are each shown coupled to ground at their drains. The transistor 36 is further shown coupled, at its gate, to the X_ADD*En_nmos signal 42 and the transistor 34 is shown coupled, at its gate, to the X_ADD*En_nmos B signal 44. The transistors 34 and 36 are typically NMOS types of transistors. The source of the transistor 36 is shown coupled to the source of the transistor 32, which is typically a PMOS type of transistor. Similarly, the source of the transistor 34 is shown coupled to the source of the transistor 30, which is also a PMOS type of transistor. The sources of the transistors 32 and 30 are shown coupled to each other. Further, the WL 20 is shown coupled to the source of each of the transistors 36 and 34 and to the source of each of the transistors 32 and 30. The gate of the transistor 30 is shown coupled to the source of the transistor 32 and the drain of each of the transistors 32 and 30 are each shown coupled to Vddx, which is a voltage generated by a charge pump and is higher than the voltage Vdd, which as well known in the art, is a voltage representing a 'high' state or a logical state of '1', and in an exemplary embodiment is 1.2 Volts. Vx is a voltage by which the WL 20 is boosted or augmented and in exemplary embodiments, it is approximately 0.3 Volts.

In the embodiment of FIG. 2, the MTJ 12 is to be programmed. In operation, during programming, the SL 18 is set to the voltage, Vx, and the BL 16 is set to Vdd or 0 V depending on whether a logical state of '1' is being programmed or a logical state of '0' is being programmed. The BL 16 and the SL 18 are "selected" BL and selected SL that are used to select the MTJ 12 for programming, as is the WL 20, the selected WL, whereas, other BLs, such as BL 38 and 40, and other SLs and other WLs do not and are therefore referred to herein as "unselected". The unselected BLs, such as the BLs 38 and 40 are set to the voltage Vdd–Vt. The SL 18 is set to the voltage Vdd–Vt.

The voltage Vddx is applied to the WL 20 and the signal 44 is at a 'low' state, which has the effect of turning 'on' the transistor 30 and makes the signal 42 be at a 'high' state. The node where the transistor 32 is shown coupled to the transistor 30 then goes 'low' and the transistor 30 turns 'on' and the voltage at the WL 20 goes 'high' but at a voltage that is higher than Vdd, such as Vddx, which turns 'off' the transistor 32 and substantially no current goes through the transistor 32. If the bit line 16 is at Vdd (for example at 1.2V) and source line 18 at Vx. This effectively programs the MTJ 12 to go from anti-parallel state to parallel state. To Program the opposite when word line 20 goes to Vddx, the source line 18 is coupled to Vdd (1.2V), while the bit line 16 is grounded.

Figure 3:
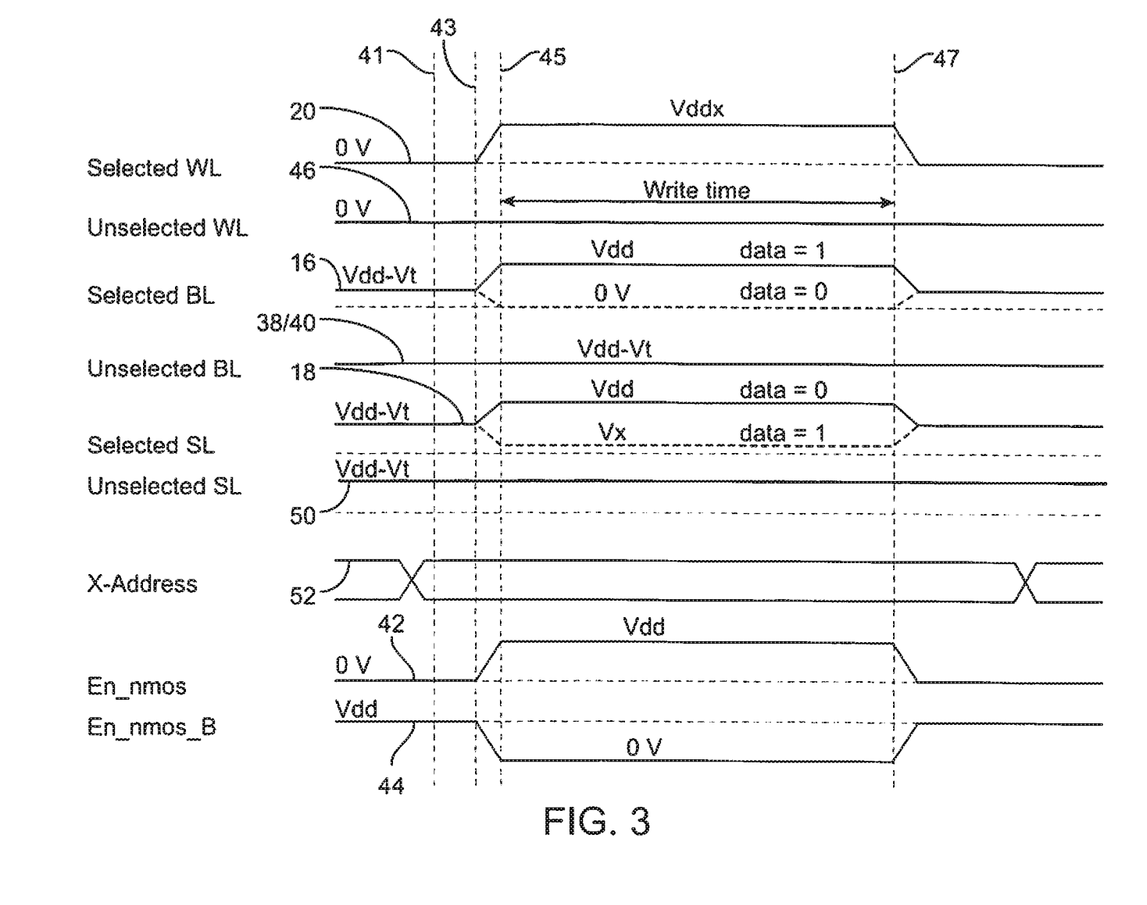
FIG. 3 shows a timing diagram of relevant signals shown in FIG. 2.

FIG. 3 shows a timing diagram of relevant signals shown in FIG. 2. When WL 20, which is the word line coupled to the MTJ being programmed, i.e. MTJ 12, is at ground, the write operation is not taking place on the unselected WLs, such as WL 46, remain at 0 volts. The selected BL, or BL 16 in FIG. 2, is shown to float, the unselected BLs, such as the BL 38 or 40 of FIG. 2, is shown be at the voltage Vdd–Vt. A typical voltage of Vdd–Vt is 1.2–0.4=0.8V volts, however, it is understood that other suitable voltage values may be employed. The selected SLs, such as the SL 18 of FIG. 2, is at Vdd minus Vt with Vt being the threshold voltage of the MTJ 12. Vdd is typically 1.2 volts but again, any suitable voltage value may be employed. The unselected SLs, such as the SL 50, is at Vdd–Vt as well. The signal 42 is at substantially 0 volts and the signal 44 is substantially at Vdd.

Next, at 41, in FIG. 3, the address of the location to be programmed or written to is coupled onto the address 52 and at 43, the signals 42 and 44 are activated, as discussed above. This causes, at 45, the WL 20 to go to Vddx, which in some embodiments is 1.5 volts or the combination of Vx and Vdd. Also, the BL 16 goes to Vdd or 0 volts, the SL 18 goes to Vdd or Vx, and the SL 50 stays at Vdd–Vt. Up to 47, in FIG. 3, the write operation takes place and the MTJ 12 is accessed and programmed and at 47, the signals 42 and 44 are deactivated, the WL 20 goes down to substantially 0 volts, the WL 46 remains at substantially 0 volts during the write operation and at 47, the BL 16 goes down to Vdd–Vt at 47, the BL 18 remains at substantially at Vdd–Vt, during programming and after 47, the SL 18, at 47, goes to Vdd minus Vt, the SL 50 goes to Vdd minus Vt, at 47, and the address 52 remains unchanged at 47 and after until a different address is identified.

Figure 4:
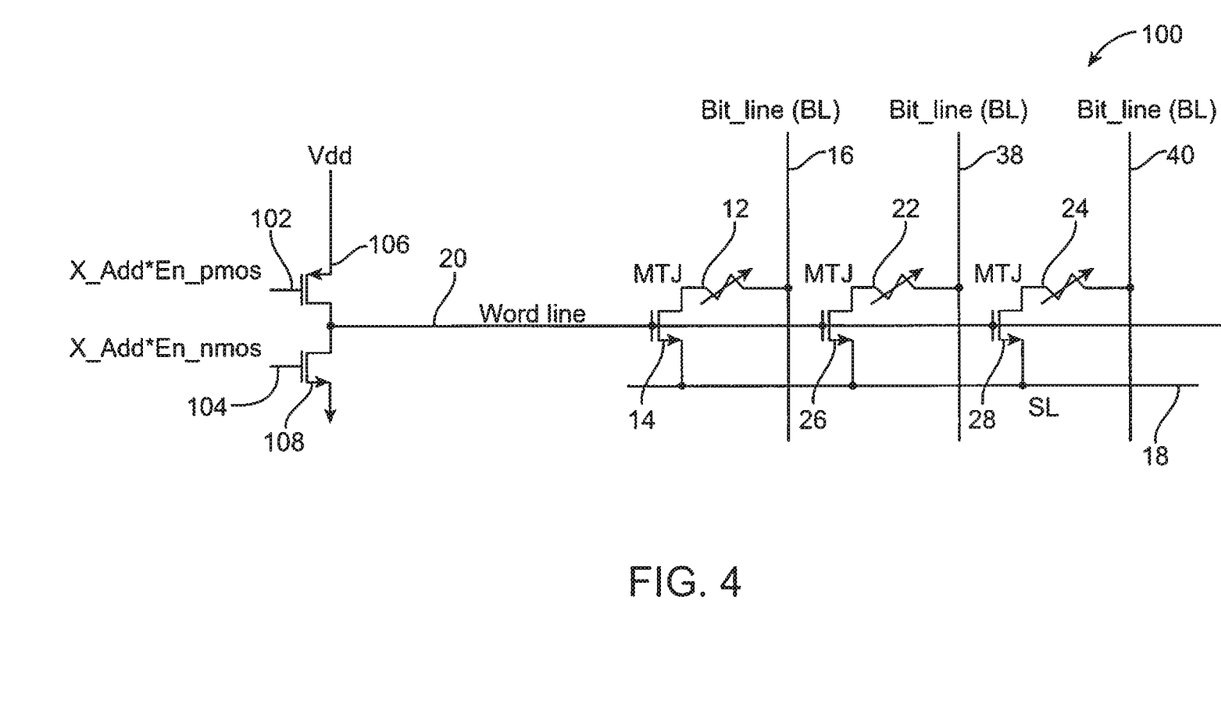
FIG. 4 shows a circuit 100 using a magnetic random access memory (MRAM) device, in accordance with another embodiment and method of the invention.

FIG. 4 shows a circuit 100 using a magnetic random access memory (MRAM) device, in accordance with another embodiment and method of the invention. In FIG. 4, the circuit 100 is shown to include the same MTJs, WL, BLs and SL, as that of the embodiment of FIG. 2. The circuit 100 is further shown to include the transistors 1 and 2, both of which are shown coupled to the WL 20. More specifically, the transistor 106 is shown to be a PMOS type of transistor and the transistor 108 is shown to be an NMOS type of transistor. The source of the transistor 106 is shown coupled to Vddx and its drain is shown coupled to the WL 20 as well as to the drain of the transistor 108. The gate of the transistor 106 is shown coupled to the X_Add*En_pmos signal 102 and the gate of the transistor 108 is shown coupled to the X_Add*En_nmos 104 signal. The source of the transistor 108 is shown coupled to ground and the drain of the transistor 108 is shown coupled to the drain of the transistor 106 and to the word line 20. The signals 102 and 104 are different in timing but the signals 42 and 44 of FIG. 2, on the other hand, are complementary such that when one is high the other one is low.

For example, when the signal 102 is at logic state '0', the transistor 106 is on and with the signal 104 being at logic state '0' or 'low', the transistor 108 is 'off' or deactivated. Accordingly, WL 20 goes from 0 volts to Vdd raising the unselected BLs and SLs, such as BLs 38 and 40 and SL 50, shown in FIG. 5, to Vdd, at the same time the signal 102 goes up to Vdd thereby deactivating the transistor 106 and causing the word line 20 to float. All these cause the WL 20 to increase in voltage by Vx thereby raising WL 20 to a total of Vdd and Vx, Vddx volts.

Figure 5:
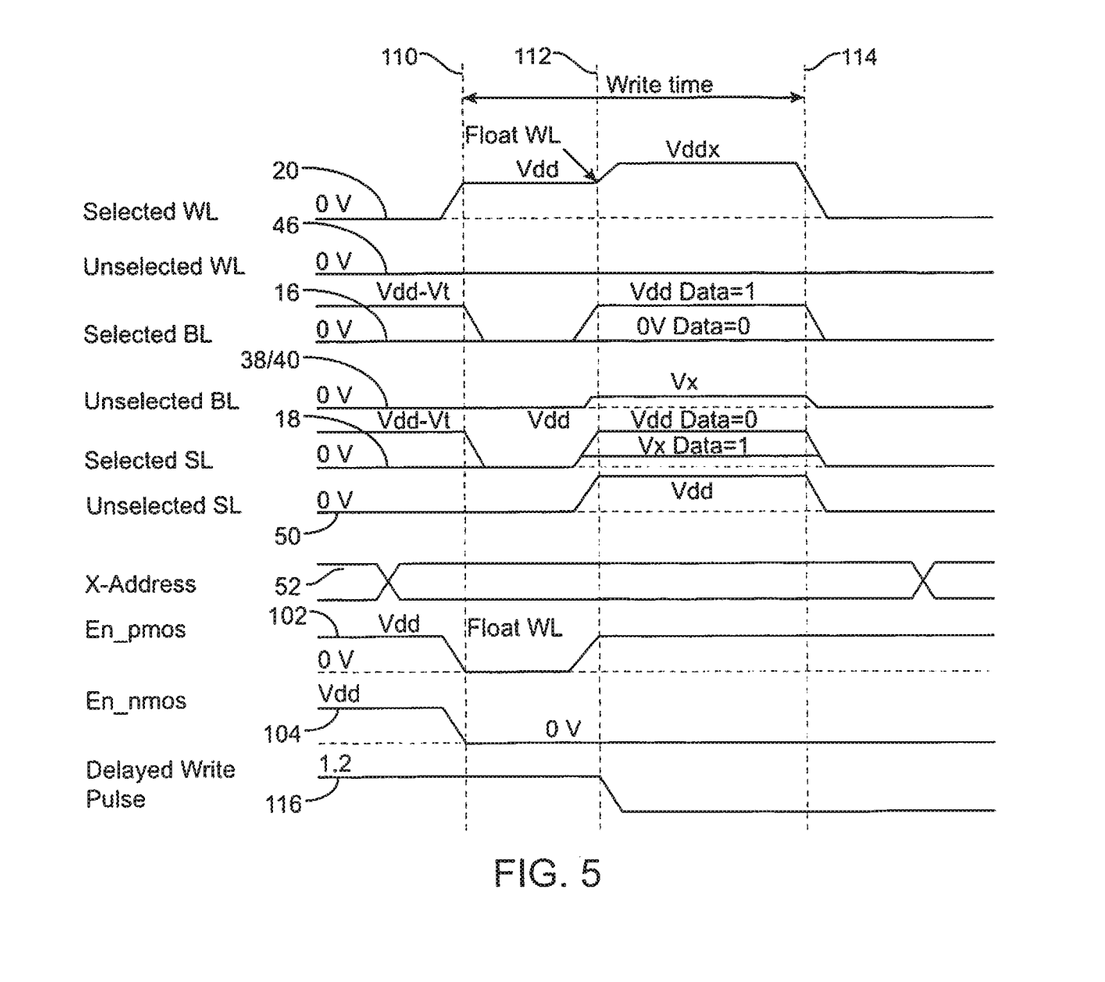
FIG. 5 shows the timing diagram of the relevant signals of FIG. 4.

FIG. 5 shows the timing diagram of the relevant signals of FIG. 4. In FIG. 5, at 110 signals 102 and 104 go down causing word line 20 to go high. At the same time signals 16, and 18 go from Vdd–Vt to Vdd or 0 depending on the data, to be written. At 112, the unselected bit lines and source lines go to Vdd, which causes the word line 20 to go to Vddx, at the same time the signal 102 goes high thereby causing floating of the word line 20 at 112. At 114, the write operation is completed and the signals go back to their original values.

In both embodiments of FIGS. 2 and 4, having the gate of the MTJ that is being programmed, i.e. the MTJ 12, raised to Vddx allows for faster programming of the MTJ while increasing the level of electric current that is allowed to flow through the MTJ.

Figure 6:
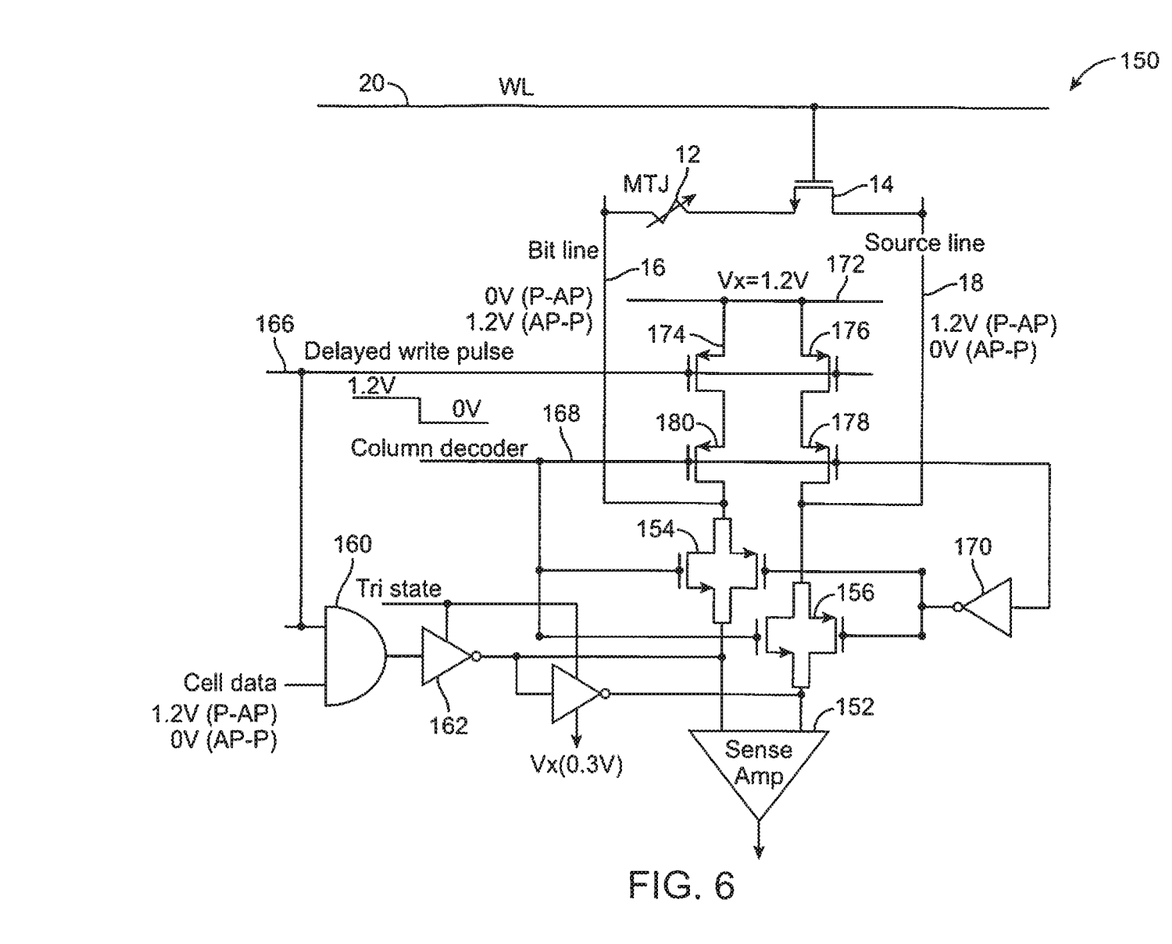
FIG. 6 shows a memory device 150, in accordance with an embodiment of the invention.

FIG. 6 shows a memory device 150, in accordance with an embodiment of the invention. In FIG. 6, some of the signals of FIG. 2, such as the WL 20, the BL 16, the SL 18 are employed. Further common to FIGS. 6 and 2 are devices, such as the MTJ 12 and the transistor 14. In FIG. 6, the programming of the MTJ 12 is shown in more detail. In this figure the MTJ 12 is coupled to bot line 16 and access transistor 14. The access transistor 14 is coupled to the word line 20 and the source line 18. To program the MTJ 12 from P to AP, the cell data input of the AND 160 is set high to 1.2V. At the same time the delayed write pulse 166 is set high (1.2V) to write, and the column decoder 168 is set high to select the bit line 16 and source line 18. With cell data at 1.2 V, the Bit line 16 would be at zero volt, while the source line 18 would be at 1.2V. This way the MTJ 12 would be programmed from P to AP. Oppositely if the cell data of the AND 160 is set to zero and delayed write pule 166 and column decoder 168 to 1.2 V, then the bit line 16 will be at 1.2 volts while source line 18 is at 1.2 V. This way the MTJ 12 is programmed from AP to P.

When the column decoder 168 is low then the specific MTJ is not selected for programming. In this situation the two pass gates 154 and 156 are off. When the delayed write pulse 166 goes from 1.2 v down to zero the two p-channel transistors 176 and 174 turn on and push both bit line 16 and source line 18 to 1.2 v. The gate capacitance of the transistor 14 then causes the bit line and source line voltage to couple to the word line and push the WL 20 voltage to Vddx, higher in value.

Although the invention has been described in terms of specific embodiment, it is anticipated that alterations and modifications thereof will no doubt become apparent to those more skilled in the art. Such alterations and modifications include, for example, extending the stacks and magnetic tunnel junction from free layer in various three-dimensional conformations, normal to the substrate surface or stacked planes on top, in order to maintain higher capacity. It is therefore intended that the following claims be interpreted as covering all such alterations and modification as fall within the true spirit and scope of the invention.

What is claimed is:

1. A method of programming a magnetoresistive tunnel junction (MTJ) coupled to a transistor, the transistor having a gate, a source, and a drain, the method comprising:

booting the voltage of a word line (WL) to a voltage substantially of Vddx volts, Vddx being substantially the sum of Vdd voltage and Vx voltage, the Vx voltage being greater than 0 volts and less than Vdd volts;

setting the voltage of a bit line (BL) to substantially the Vdd volts, the BL coupled to an end of the MTJ, the drain of the access transistor being coupled to an opposite end of the MTJ, a source line (SL) coupled to the source of the access transistor;

raising the SL to be substantially at Vx volts; and programming the MTJ to a parallel state.

2. The method of programming, as recited in claim 1, further including increasing the speed of programming by raising the voltage of the SL to Vx volts.

3. The method of programming, as recited in claim 1, wherein the resistive element includes an MTJ.

* * * * *